US012568821B2

(12) United States Patent
Tang et al.

(10) Patent No.: US 12,568,821 B2
(45) Date of Patent: Mar. 3, 2026

(54) PIN FIN PLACEMENT ASSEMBLY FOR FORMING TEMPERATURE CONTROL ELEMENT UTILIZED IN DEVICE DIE PACKAGES

(71) Applicant: Google LLC, Mountain View, CA (US)

(72) Inventors: Yingshi Tang, Danville, CA (US); Yingying Wang, Sunnyvale, CA (US); Padam Jain, San Jose, CA (US); Emad Samadiani, Cypress, CA (US); Sudharshan Sugavanesh Udhayakumar, San Jose, CA (US); Madhusudan K. Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 774 days.

(21) Appl. No.: 17/876,813

(22) Filed: Jul. 29, 2022

(65) Prior Publication Data

US 2024/0038620 A1     Feb. 1, 2024

(51) Int. Cl.
  *H01L 23/367*     (2006.01)
  *H01L 21/48*     (2006.01)
  *H01L 23/00*     (2006.01)
  *H01L 23/31*     (2006.01)
  *H01L 23/467*     (2006.01)
(52) U.S. Cl.
  CPC ...... *H01L 23/3677* (2013.01); *H01L 21/4871* (2013.01); *H01L 21/4882* (2013.01); *H01L 23/3128* (2013.01); *H01L 23/467* (2013.01); *H01L 24/18* (2013.01); *H01L 2224/16227* (2013.01); *H01L 2924/1811* (2013.01)

(58) Field of Classification Search
  CPC ............. H01L 23/3677; H01L 23/3128; H01L 23/467; H01L 24/18; H01L 21/4882; H01L 21/4871; H01L 23/46
  See application file for complete search history.

(56) References Cited

U.S. PATENT DOCUMENTS 5,292,054 A  *  3/1994  Leeb ................... H01L 21/4882
                                                  228/183
5,499,450 A     3/1996  Jacoby
                (Continued)

FOREIGN PATENT DOCUMENTS

JP        2012129336 A     7/2012
JP        2016009718 A     1/2016

OTHER PUBLICATIONS

Extended European Search Report for European Patent Application No. 23156739.7 dated Dec. 14, 2023. 7 pages.
(Continued)

*Primary Examiner* — Brent A. Fairbanks
*Assistant Examiner* — Emilio Ardeo
(74) *Attorney, Agent, or Firm* — Lerner David LLP

(57) ABSTRACT

A pin fin placement assembly utilized to form pin fins in a thermal dissipating feature is provided. The pin fin placement assembly may place the pin fins on an IC die disposed in the IC package. The pin fin placement assembly may assist massively placing the pin fins with desired profiles and numbers on desired locations of the IC die. The plurality of pin fins is formed in a first plurality of apertures in the pin fin placement assembly. A thermal process is then performed to solder the plurality of pin fins on the IC die.

20 Claims, 12 Drawing Sheets

(56)         References Cited

U.S. PATENT DOCUMENTS

|  |  |  |  |  |
|---|---|---|---|---|
| 5,988,266 | A | | 11/1999 | Smith et al. |
| 6,003,586 | A | * | 12/1999 | Beane .................... B22D 25/02 |
| | | | | 164/63 |
| 6,539,614 | B2 | * | 4/2003 | Trobough ............... B23P 15/26 |
| | | | | 165/185 |
| 7,459,782 | B1 | | 12/2008 | Li |
| 7,724,527 | B2 | | 5/2010 | Coico et al. |
| 7,781,883 | B2 | | 8/2010 | Sri-Jayantha et al. |
| 8,299,608 | B2 | | 10/2012 | Bartley et al. |
| 9,070,656 | B2 | | 6/2015 | Hooper et al. |
| 9,735,043 | B2 | | 8/2017 | Ho et al. |
| 10,553,522 | B1 | | 2/2020 | Canaperi et al. |
| 10,727,160 | B2 | | 7/2020 | Kulkarni et al. |
| 2005/0122126 | A1 | * | 6/2005 | Ferland ................ H05K 7/1076 |
| | | | | 29/846 |
| 2006/0126308 | A1 | * | 6/2006 | Campbell ........... H01L 23/3677 |
| | | | | 257/E23.09 |
| 2007/0039998 | A1 | * | 2/2007 | Sato .................. H01L 21/67138 |
| | | | | 228/20.1 |
| 2007/0053168 | A1 | | 3/2007 | Sayir et al. |
| 2009/0314467 | A1 | | 12/2009 | Campbell et al. |
| 2011/0042784 | A1 | | 2/2011 | Edwards et al. |
| 2012/0006383 | A1 | | 1/2012 | Donnelly |
| 2012/0241953 | A1 | | 9/2012 | Yamada et al. |
| 2013/0258595 | A1 | | 10/2013 | Tuckerman |
| 2015/0179551 | A1 | | 6/2015 | Nakamura et al. |
| 2019/0074237 | A1 | | 3/2019 | Beauchemin et al. |
| 2021/0098335 | A1 | | 4/2021 | Yu et al. |

OTHER PUBLICATIONS

Extended European Search Report for European Patent Application
No. 23194330.9 dated Feb. 1, 2024. 9 pages.

* cited by examiner

520

525

524

525

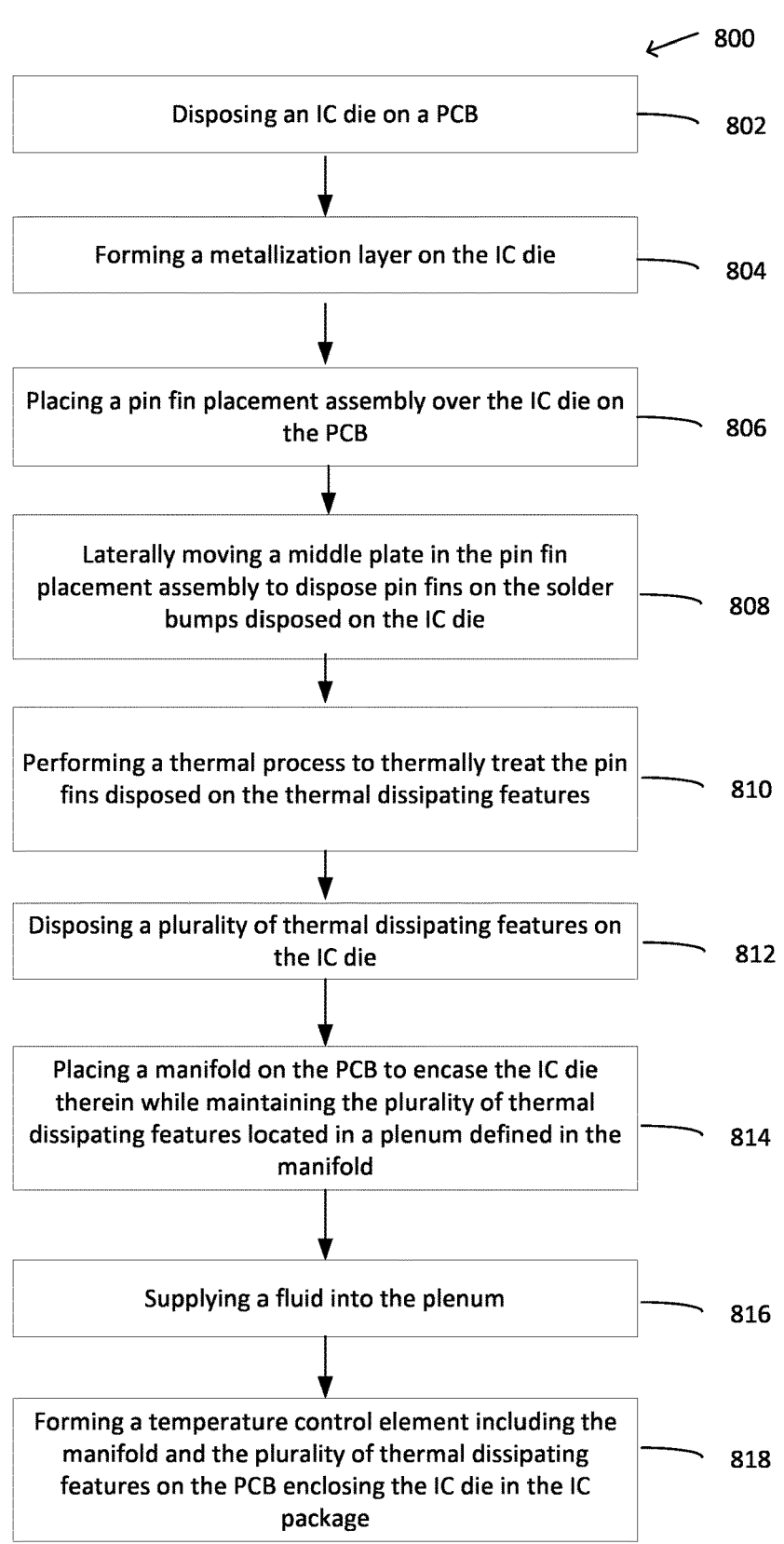

800

Disposing an IC die on a PCB — 802

Forming a metallization layer on the IC die — 804

Placing a pin fin placement assembly over the IC die on the PCB — 806

Laterally moving a middle plate in the pin fin placement assembly to dispose pin fins on the solder bumps disposed on the IC die — 808

Performing a thermal process to thermally treat the pin fins disposed on the thermal dissipating features — 810

Disposing a plurality of thermal dissipating features on the IC die — 812

Placing a manifold on the PCB to encase the IC die therein while maintaining the plurality of thermal dissipating features located in a plenum defined in the manifold — 814

Supplying a fluid into the plenum — 816

Forming a temperature control element including the manifold and the plurality of thermal dissipating features on the PCB enclosing the IC die in the IC package — 818

FIG. 8

PIN FIN PLACEMENT ASSEMBLY FOR FORMING TEMPERATURE CONTROL ELEMENT UTILIZED IN DEVICE DIE PACKAGES

BACKGROUND

Electronic components such as chip assemblies or integrated circuit (IC) dies are often used in electronic devices, such as tablets, computers, copiers, digital cameras, smart phones, control systems, and automated teller machines, among others. The demand for high-performance electronic devices has led to developments in electronic component designs. For instance, to increase the performance of an electronic component, the size of the electronic component is often decreased, while the number of integrated components (e.g., transistors) within the electronic component is increased. However, the decrease in size and increase in the number of components in the electronic components can lead to thermal management issues, such as overheating. Such overheating may result in device failure or electrical performance deterioration.

SUMMARY

The present disclosure relates to a pin fin placement assembly utilized to form a temperature control element that may be utilized in an IC package assembly. The temperature control element may include a plurality of pin fins disposed on solder paste. The pin fin placement assembly is utilized to dispose pin fins on an IC die disposed in the IC package. The pin fin placement assembly may assist with placing and soldering the pin fins on desired locations of the IC die. The pin fins of the temperature control element may be an integral part of the IC package assembly that may assist temperature control of the IC die when in operation. When such IC package assembly with temperature control element is assembled, the thermal dissipation efficiency for the overall IC package is then enhanced. In one example, a method for manufacturing a temperature control element in an IC package includes placing a pin fin placement assembly on a PCB including an IC die disposed thereon. A plurality of pin fins is provided in a first plurality of apertures in the pin fin placement assembly. A thermal process is performed. The plurality of pin fins is soldered on the IC die.

In one example, the pin fin placement assembly is removed from the PCB. The plurality of pin fins is provided in the first plurality of apertures formed in a top plate of the pin fin placement assembly.

In one example, the plurality of pin fins is driven in the first plurality of apertures in the top plate by vibration or brushing. A middle plate is pulled in the pin fin placement assembly in a lateral direction. The plurality of pin fins is dropped down from the first plurality of apertures in the top plate to a second plurality of apertures formed in a bottom plate disposed below the middle plate.

In one example, the first plurality of apertures formed in the top plate is vertically aligned with the second plurality of apertures formed in the bottom plate. The plurality of pin fins is maintained in a second plurality of apertures formed in a bottom plate in the pin fin placement assembly while performing the thermal process. The pin fins are soldered onto a corresponding solder bump formed on the IC die. The pin fin placement assembly is placed in an alignment hole formed in the PCB. The pin fin placement assembly allows the plurality of pin fins to be placed on the IC die simultaneously.

In one example, a manifold is placed on the PCB to encase the IC die therein while maintaining the plurality of pin fins located in a plenum defined in the manifold. A fluid is supplied into the plenum to regulate a thermal energy transmitted from the IC die. The pin fins are manufactured from a material selected from copper, aluminum, tungsten, gold, silver, combinations thereof or alloys thereof. The plurality of pin fins has a circular configuration, a rectangular configuration, or a longitudinal structure.

In one example, the plurality of pin fins is arranged in one or more arrays or matrices.

Another aspect of the technology is directed to a method for manufacturing a temperature control element in an IC package. The method includes placing a pin fin placement assembly on a PCB including an IC die disposed thereon. The pin fin placement assembly includes a top plate, a middle plate, and a bottom plate vertically assembled.

In one example, a plurality of pin fins is provided in a first plurality of apertures in the top plate of the pin fin placement assembly. The middle plate is laterally moved to allow the plurality of pin fins dropped in a second plurality of aperture in a bottom plate in the pin fin placement assembly. A thermal process is performed. The plurality of pin fins is soldered on the IC die.

In one example, the top plate of the pin fin placement assembly is removed prior to performing the thermal process. The plurality of pin fins is maintained in a second plurality of apertures in the bottom plate while performing the thermal process. A manifold is placed on the PCB to encase the IC die therein while maintaining the plurality of pin fins located in a plenum defined in the manifold. A fluid is supplied into the plenum to regulate a thermal energy transmitted from the IC die.

Yet another aspect of the technology is directed to a pin fin placement assembly. The pin fin placement assembly includes a top plate, a middle plate, and a bottom plate vertically assembled to form a plate body. The middle plate is laterally movable relative to the top plate or the bottom plate. A supporting post is disposed below the plate body. A first plurality of apertures is formed in the top plate. A second plurality of apertures formed in the bottom plate. The first and the second plurality of apertures are vertically aligned. The first and the second apertures are configured to receive pin fins to be disposed on an IC die

DESCRIPTION OF THE DRAWINGS

FIG. 8 depicts a flow diagram for manufacturing an IC package including a temperature control element formed therein in accordance with aspects of the disclosure.

DETAILED DESCRIPTION

The present disclosure relates to a pin fin placement assembly utilized to form pin fins in a thermal dissipating feature that may be utilized to dispose pin fins on an IC die disposed in the IC package. The pin fin placement assembly may assist massively placing the pin fins with desired profiles and numbers on desired locations of the IC die. The pin fins may be an integral part of the IC package assembly that may assist temperature control of the IC die when in operation. When such IC package assembly with the pin fins are assembled, the thermal dissipation efficiency for the overall IC package is then enhanced. In one example, a plurality of thermal dissipating features are disposed on a first surface of an IC die encased under a manifold to efficiently control and dissipate the thermal energy from the IC die when in operation. A second surface opposite to the first surface of the IC die may include a plurality of devices, such as semiconductors transistors, devices, electrical components, circuits, or the like, that may generate thermal energy when in operation. In one example, the thermal dissipating features may include a plurality of pin fins disposed on the IC die. The pin fins may be disposed on the IC die by utilizing a pin fin placement assembly during the manufacturing process. The pin fin placement assembly may assist with placing and holding the pin fins at desired locations on the IC die efficiently and precisely. Different configurations of the thermal dissipating features may be utilized to accommodate different device layouts with different thermal energy generation across the substrate in the IC die.

Figure 1:
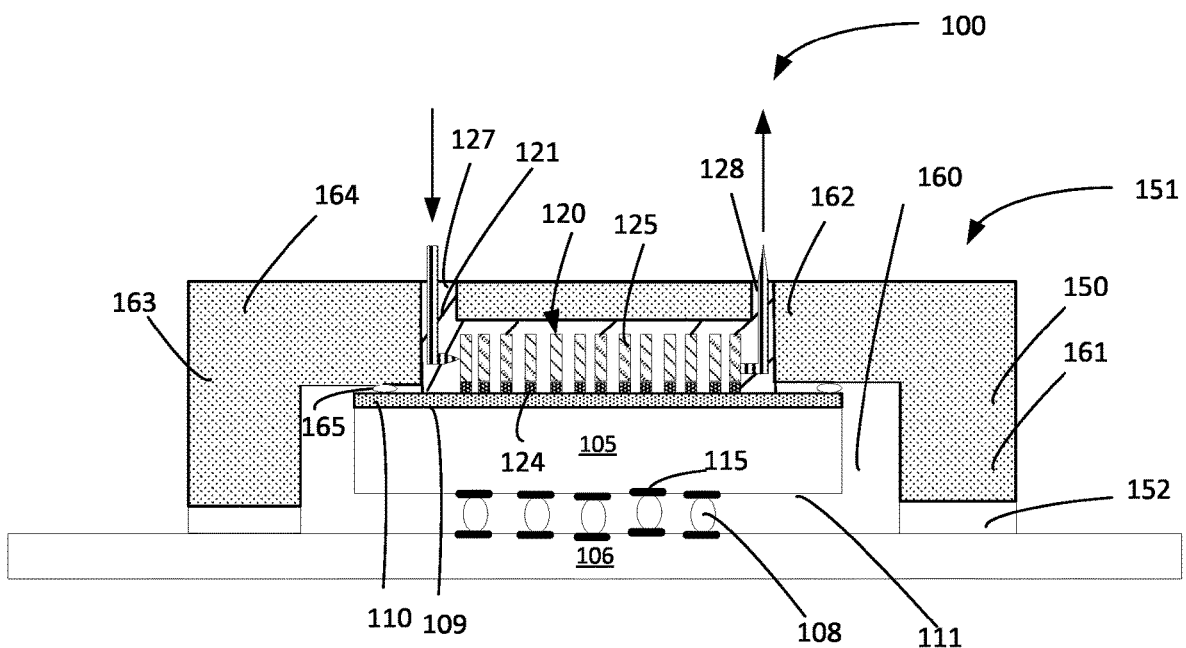
FIG. 1 depicts a cross-sectional view of a temperature control element utilized in an IC package assembly in accordance with aspects of the disclosure.

FIG. 1 depicts a cross sectional-view of an IC package 100, including an IC die 105 formed on a printed circuit board (PCB) 106. Although the example depicted in FIG. 1 only includes one IC die 105 and one PCB 106, it is noted that an IC package may include any number of IC dies, and PCBs. The IC dies and the devices or chip assemblies disposed within the IC package 100 may be in any numbers. In one example, the IC die 105 may be a graphics processing unit (GPU), custom application-specific integrated circuit (ASIC), memory devices, high-bandwidth memory (HBM) components, or any other type of device or stack. In one example, the IC die 105 is disposed on the PCB 106 through a plurality of solder balls 108 arranged in a ball grid array (BGA). Other arrangements and connectors may include contacts arranged in a land grid array (LGA), connector pins arranged in a pin grid array (PGA), etc.

In one example, a temperature control element 151 is utilized to encase the IC die 105. The temperature control element 151 overlies an adhesive material 152. The adhesive material 152 provides a sealing interface between the temperature control element 151 and the PCB 106. The temperature control element 151 includes a manifold 150 having a first side wall 161 and a second sidewall 163 connected by a ceiling 162, forming a substantially U-shape body 164 that defines a central cavity 160 on a bottom side of the manifold 150. The central cavity 160 encases IC die 105 when the temperature control element 151 is placed or mounted on the PCB 106. A sealing member 165 may be utilized to seal the interface where the manifold 150 is in contact with the IC die 105. In one example, the sealing member 165 may be an adhesive material, an 0 ring, or suitable mechanical attachments that facilitate positioning and securement of the manifold 150 to the IC die 105. A plenum 121 may be defined in the ceiling 162 of the manifold 150. The plenum 121 may allow fluid, air, liquid, or other such cooling material to be introduced therein for temperature control purposes to the IC die 105 when the temperature control element 151 is in place for operation.

A plurality of thermal dissipating features 120 may be disposed on a first surface 109 of the IC die 105 that may assist in dissipating thermal energy from the IC die 105 when IC die 105 is in operation. In one example, the plurality of thermal dissipating features 120 may be disposed on the first surface 109 of the IC die 105 by plating, soldering, or any other suitable process. A second surface 111 is formed substantially in parallel and opposite to the first surface 109 where a plurality of device structures 115 may be disposed. A metallization layer 110 may be formed on the surface 109 of the IC die 105 to facilitate soldering the plurality of thermal dissipating features 120 thereon. In one example, the metallization layer 110 may be manufactured from a conductive material, such as copper, aluminum, tungsten, nickel, silver, iron, combinations thereof, alloys thereof or the like.

In one example, each of the thermal dissipating features 120 may include a pin fin 125 disposed on solder paste 124 or solder pumps. The solder paste 124 may secure the metallic pin fins 125 onto the first surface 109 of the IC die 105 once soldered. In one example, the pin fin 125 may be manufactured from a metallic material that has good thermal dissipation or thermal transmission efficiency. Examples of metallic materials that may be selected to manufacture the pin fin 125 include copper, aluminum, tungsten, gold, silver, combinations thereof, alloys thereof, or the like. In one example, the pin fin 125 may have an aspect ratio, such as a height to diameter ratio, between about 1:1 and 20:1, such as about 10:1 or 5:1.

In one example, the thermal dissipating features 120 may be disposed on the surface 109 of the IC die 105 in the form of one or more arrays or matrices. In one example, The pin fin 125 may have a pitch between about 100 μm and about 500 μm, such as between about 150 μm and about 300 μm, such as about 200 μm. When in operation, fluid may be supplied from an inlet 127 to circulate through the plenum 121 to an outlet 128. In one example, the number and configuration of inlets and outlets can vary, such as an inlet disposed between two outlets, two inlets and two outlets, etc. The fluid as supplied may include liquid, air, or other suitable cooling mediums that may efficiently reduce the temperature of the IC die 105 with which the fluid is in direct contact. The thermal dissipating features 120, such as the pin fins 125 included therein, may increase contact surface area when the fluid is in circulation in the plenum 121. The increased contact surface provided area may enhance the cooling performance.

Figure 2A:
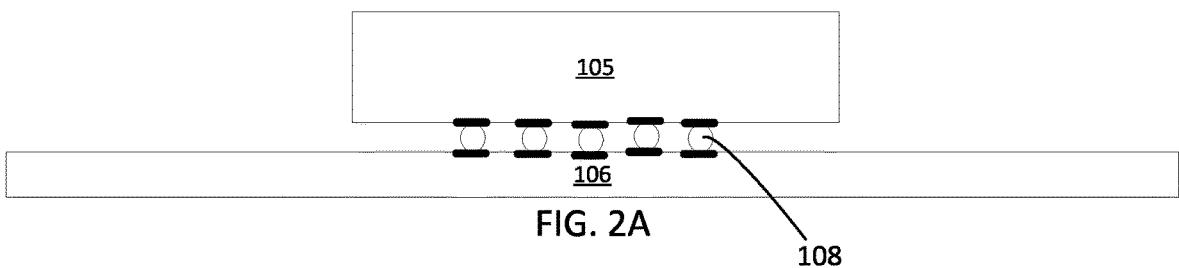
FIGS. 2A-2J depict cross-sectional views of an IC package assembly at different stages of manufacturing a temperature control element on an IC die of the IC package assembly using a pin fin placement assembly in accordance with aspects of the disclosure.
Figure 2B:
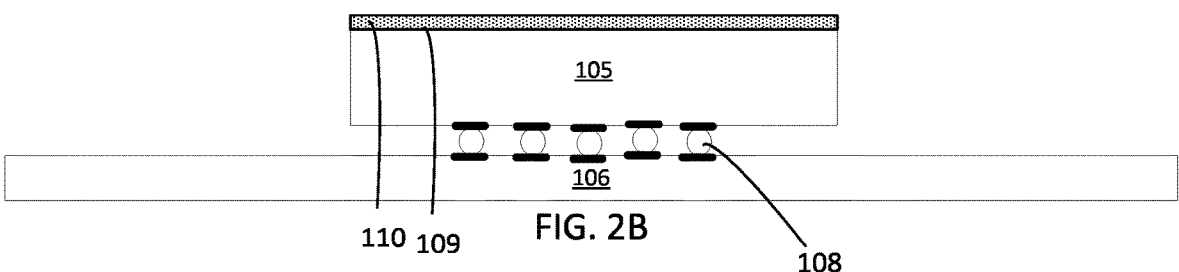

FIGS. 2A-2J depict cross-sectional views of an IC package assembly during different stages of implementing the temperature control element on the IC die 105 of FIG. 1. In FIG. 2A, the IC die 105 is soldered on the PCB 106. After the IC die 105 is soldered, the metallization layer 110 may be disposed or otherwise formed on the surface 109 of the IC die 105, as shown in FIG. 2B. In some examples, the metallization layer 110 may be disposed or otherwise formed on the surface 109 of the IC die 105 prior to soldering the IC die 105 to the PCB 106. For example, the metallization layer 110 may be deposited or formed on the IC die 105 as part of the manufacturing steps fulfilled by the IC manufacturing facilities prior to shipping to the IC packaging facility to be soldered on the PCB 106.

Figure 2C:
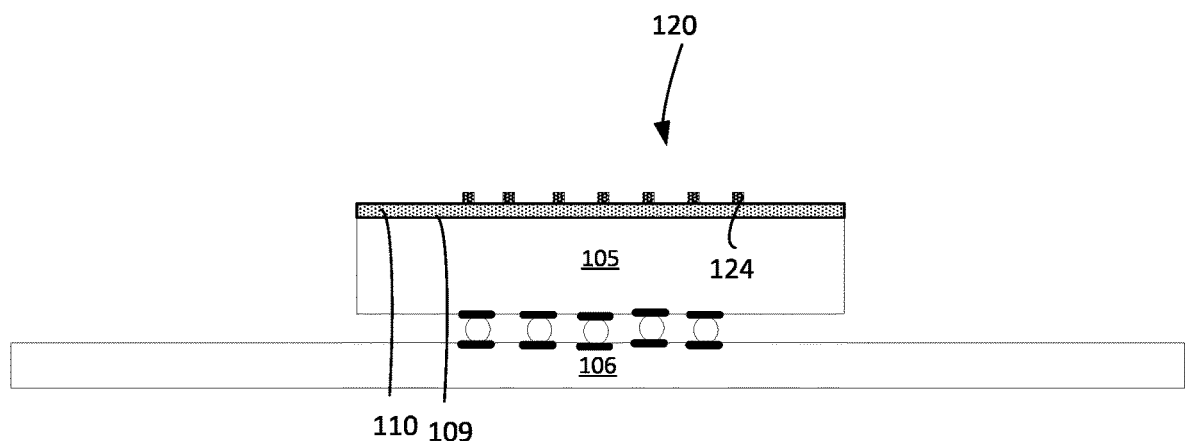

In FIG. 2C, a plurality of the solder paste 124 is printed and disposed on the surface 109 of the IC die 105. The solder paste 124 may facilitate attaching the pin fins 125 onto the surface 109 of the IC die 105 for temperature control when in operation.

Figure 2D:
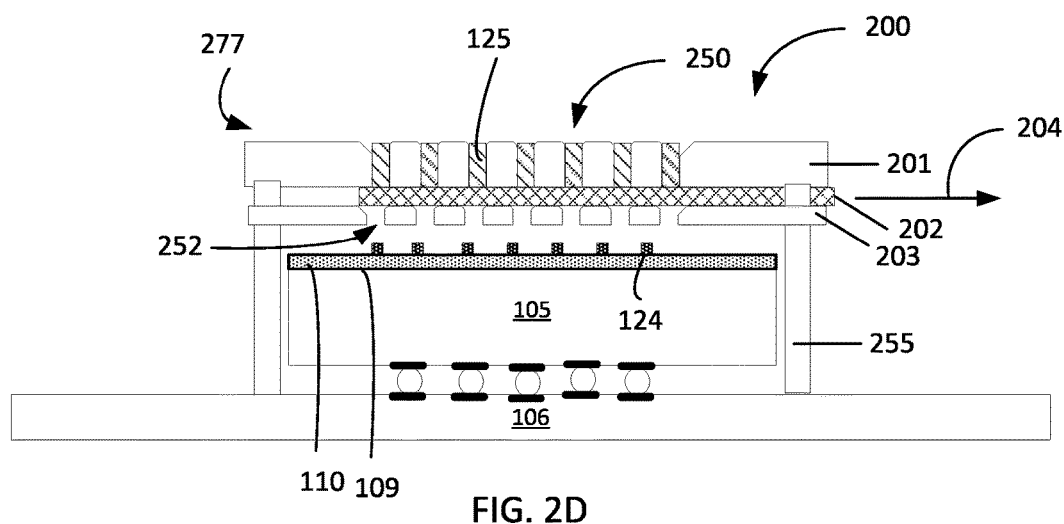

In FIG. 2D, a pin fin placement assembly 200 is utilized to place the pin fins 125 onto the solder paste 124. In one example, as depicted in FIG. 2D, the pin fin placement assembly 200 includes a top plate 201, a middle plate 202, and a bottom plate 203 vertically assembled to form a plate body 277. The plate body 277 is disposed on one or more supporting posts 255. The supporting posts 255 may serve as alignment pins that may be placed into alignment holes (not visible in FIG. 2D) formed in the PCB 106. In one example, the top plate 201 has a plurality of apertures 250 formed therein and configured to receive pin fins 125 therein. The pin fins 125 may be pre-manufactured metallic structures with desired profiles and configurations. For example, the pin fins 125 may be pre-manufactured metallic structures with desired aspect ratios, such as a particular diameter to height ratio. The profile may be adjusted such that the pin fins, when soldered onto the IC die 105, adequately dispatch heat generated by the IC die to the cooling material.

The dimensions, distributions, and the numbers of the apertures 250 formed in the top plate 201 may be configured to accommodate the dimensions of the pin fins 125. In one example, the dimensions, distributions, and the numbers of the pin fins 125 may be determined based on the amount of thermal energy needed to be dispatched from the IC die 105 where the pin fins 125 are mounted. For example, when a higher thermal flux of thermal energy is desired to be dispatched from the IC die 105, higher numbers or higher placement density of the pin fins 125 may be configured to be formed on the IC die 105. It is noted that the dimensions, distributions, profiles, and the numbers of the pin fins 125 may be configured in any manner.

In one example, the pin fins 125 may be poured and placed into the apertures 250 of the top plate 201. Ultrasonic vibrations, mechanical movements or mechanical vibrations, or a brush may be utilized to drive the pin fins 125 into the apertures 250 of the top plate 201, as shown in FIG. 2D. Once the pin fins 125 are placed and filled in the apertures 250 of the top plate 201 above the middle plate 202, redundant pin fins 125 may be removed from the top plate 201.

Figure 2E:
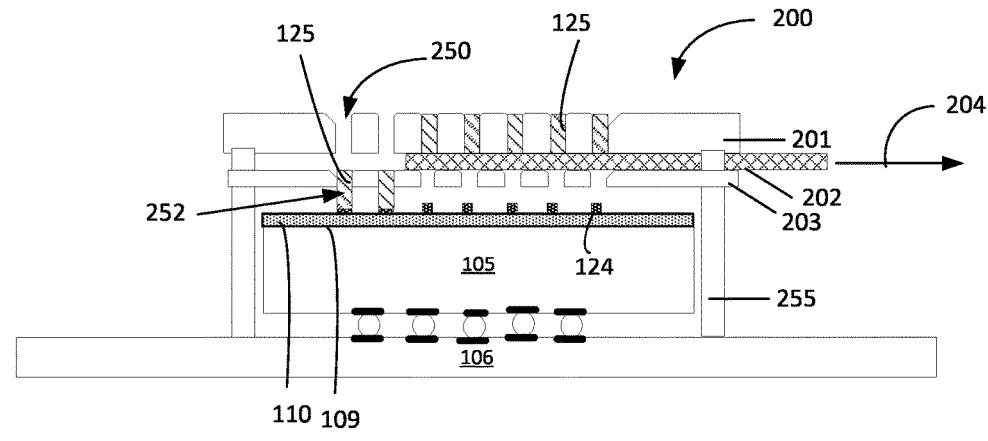

In FIG. 2E, the middle plate 202 is partially pulled out in a lateral direction, as shown by arrow 204. Once the middle plate 202 is pulled, the pin fins 250 in the top plate 201 without the support from the middle plate 202 are dropped down to the apertures 252 formed in the lower plate 203. The apertures 252 in the lower plate 203 are vertically aligned with the apertures 250 formed in the top plate 201 to allow the pin fins 125 to be dropped down to a desired position on the IC die 105 through the alignment from the lower plate 203. In one example, the pin fins 125 are configured to be dropped down to the corresponding solder paste 124 to dispose on the IC die 105. Thus, when the middle plate 202 is laterally pulled, the pin fins 125 may then be dropped down onto the corresponding solder paste 124.

Figure 2F:
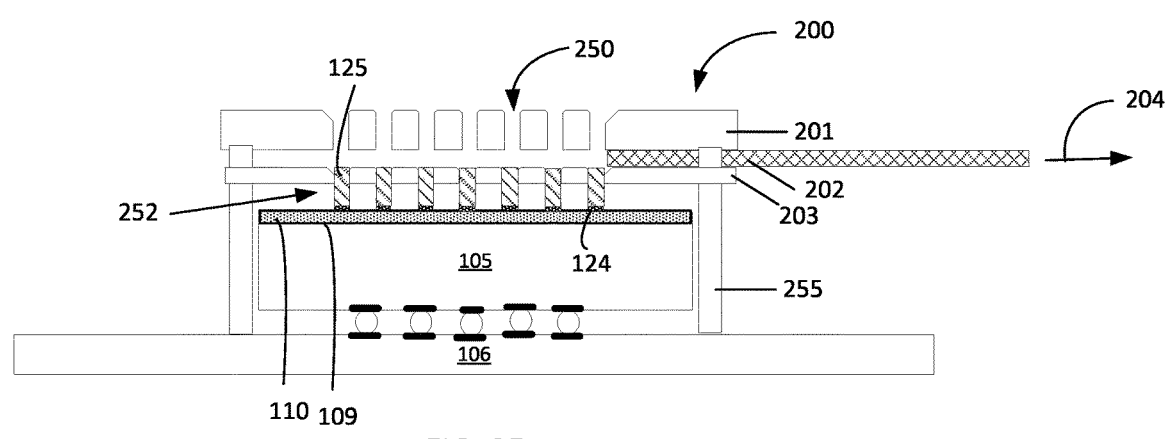

In FIG. 2F, the middle plate 202 is pulled out in the lateral direction to allow the pin fins 250 to drop from the top plate 201 to down to the corresponding apertures 252 in the bottom plate 203.

Figures 2G, 2H:
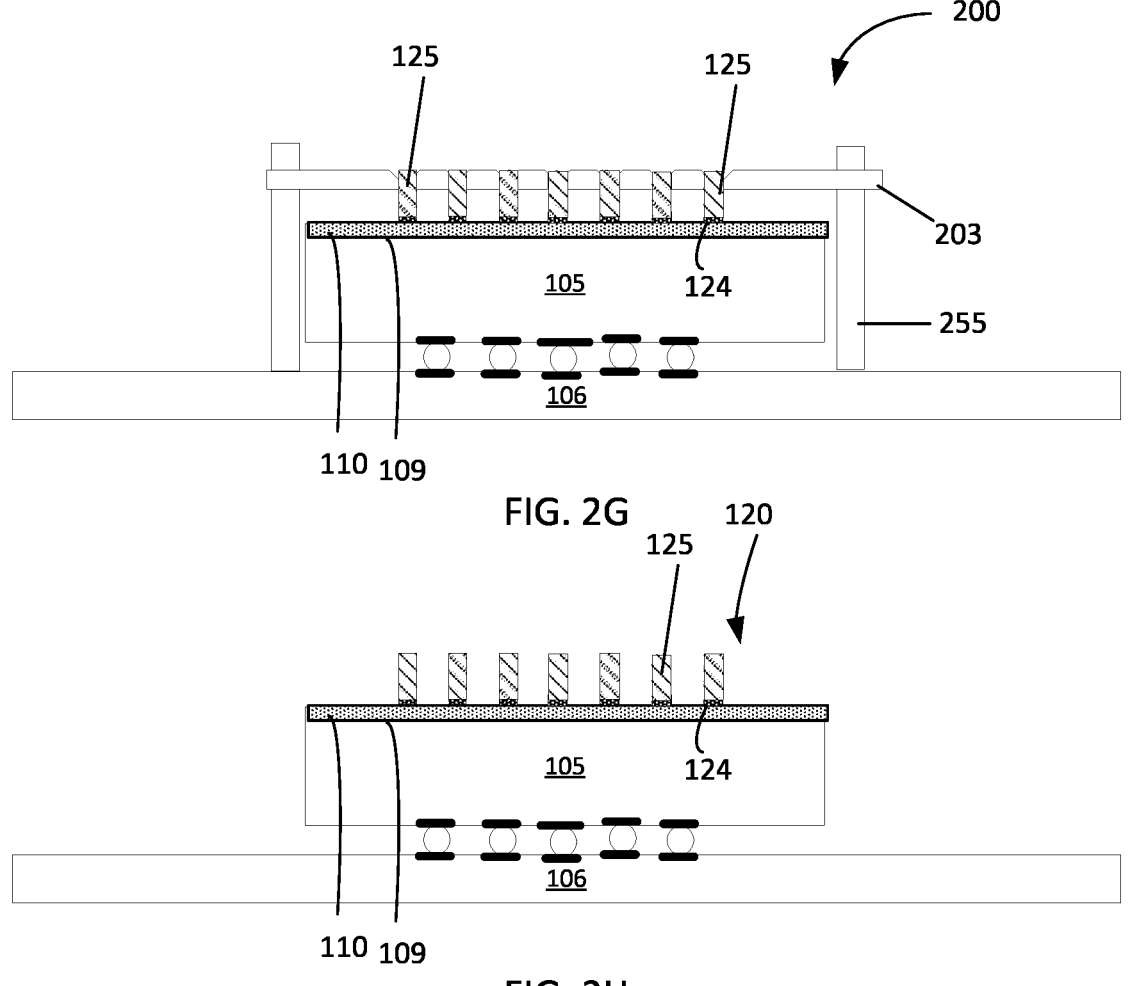

In FIG. 2G, once the pin fins 250 is in place in the bottom plate 203, the top plate 201 along with the middle plate 202 may be disassembled and removed from the pin fin placement assembly 200. The top plate 201 and/or the middle plate 202 removed from the pin fin placement assembly 200 may reduce the thermal mass during the subsequent thermal treatment process. In some examples, the top plate 201 and the middle plate 202 may or may not be removed during the subsequent thermal treatment process.

The thermal treatment process may provide thermal energy to adhere the pin fins 125 onto the solder paste 124 with sufficient and desired adhesion. As illustrated in FIG. 2G, the bottom plate 203 remains in place during the thermal treatment process. In this regard, the bottom plate 203 holds the pin fins 125 in place as the pin fins 125 are secured to the IC die 105 via the solder paste 124. The holding and support from the bottom plate 203 during the thermal treatment process may assist the pin fins 125 to be formed onto the solder paste 124 or on the metallization layer 110 with desired integrity and profile without undesired collapse and deterioration.

In FIG. 2H, once the pin fins 125 are securely formed onto the solder paste 125, the pin fin placement assembly 200 may be removed from the PCB 106, forming the thermal dissipating features 120 including the pin fins 125 and the solder paste 124 on the IC die 105.

Figure 2I:
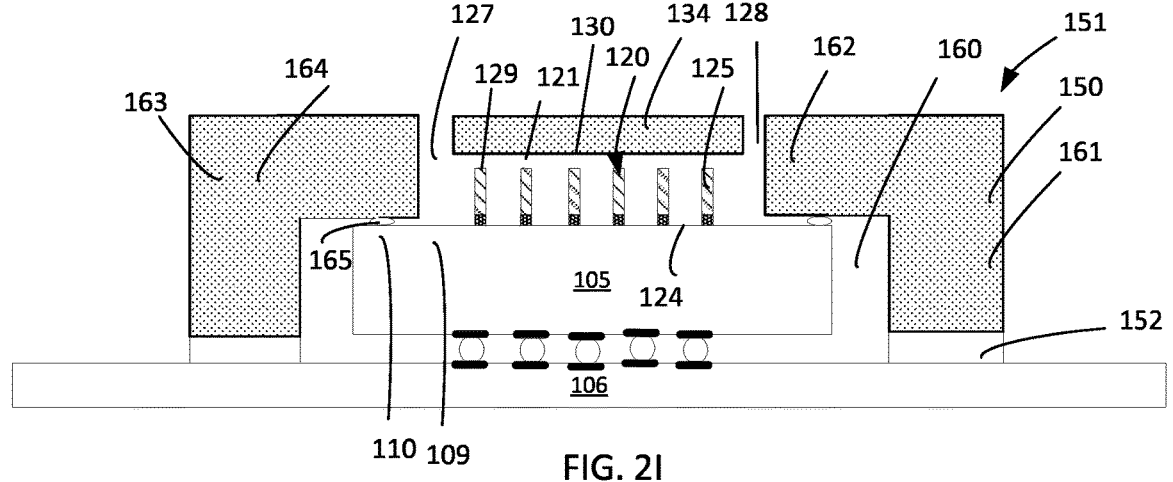

In FIG. 2I, the manifold 150 may be disposed on the PCB 106 through adhesive material 152. The manifold 150 is positioned in a manner that allows the central cavity 160 of the manifold 150 to encase the IC die 105 therein while allowing the plurality of thermal dissipating features 120 to be encased in the plenum 121. The height of the thermal dissipating features 120 may be controlled in a manner so that a top 129 of the thermal dissipating features 120 may be maintained spaced apart from a bottom surface 130 of the center portion 134 of the ceiling 162. It is noted that different configurations of the thermal dissipating features 120 may be utilized to enhance thermal energy circulation and thermal dissipation efficiency. Once the manifold 150 is placed on the PCB 106 with the plurality of thermal dissipating features 120 disposed on the IC die 105, the installation of the temperature control element 151, including the manifold 150 and the thermal dissipating features 120 is then considered completed.

Figure 2J:
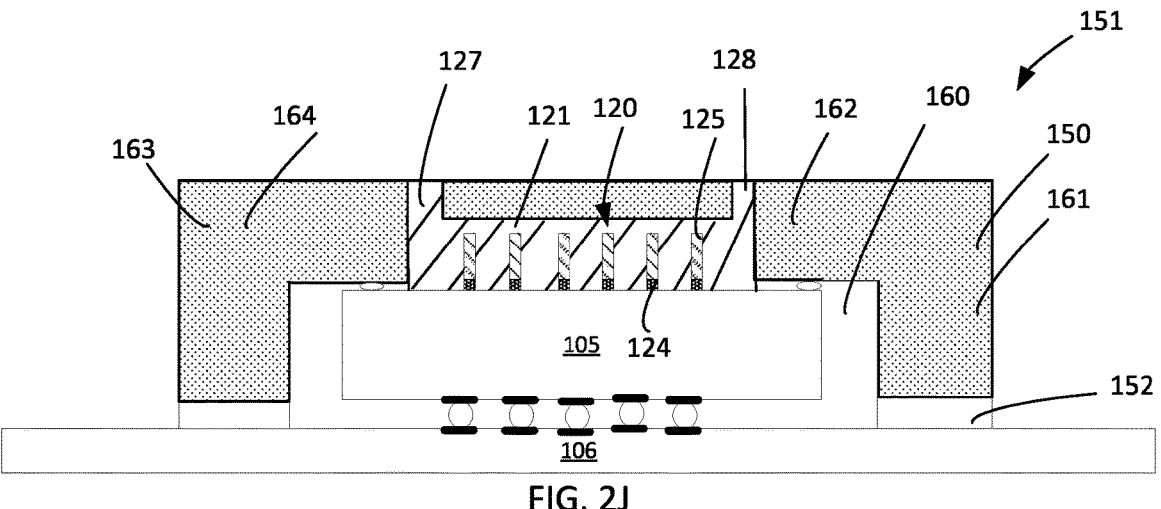

In FIG. 2J, once the manifold 150 is in place, fluid may be supplied to the plenum 121 to facilitate temperature control of the IC die 105 through the plurality of thermal dissipating features 120 disposed on the IC die 105.

Figures 3A, 3B:
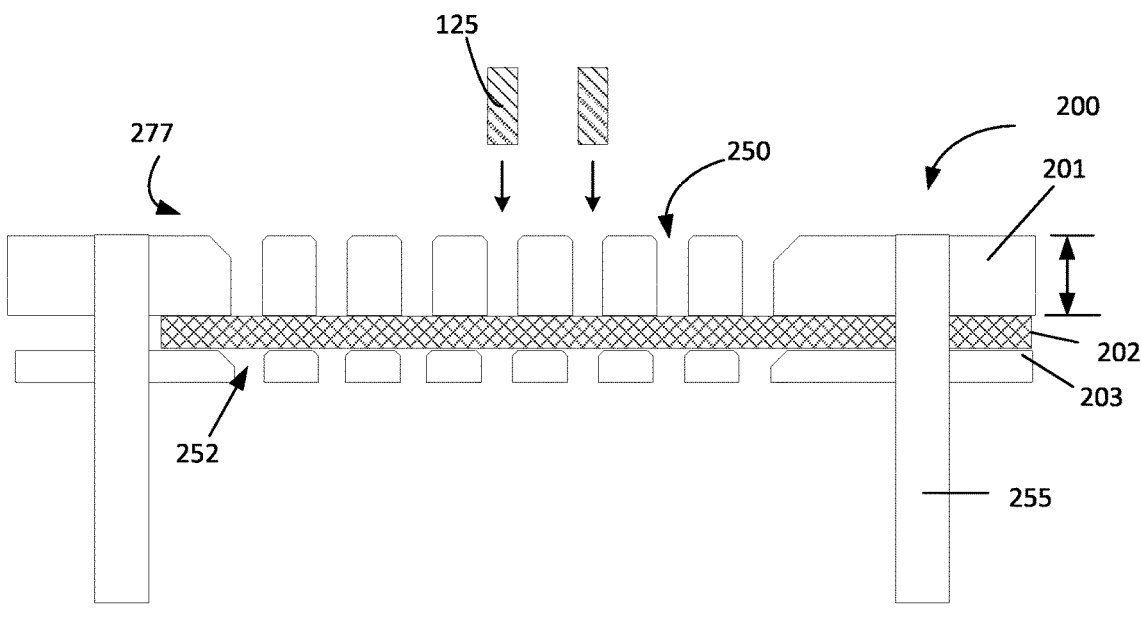
FIGS. 3A-3B depict cross-sectional views of an example of a pin fin placement assembly.

FIG. 3A-3B depict cross-sectional views of an example of the pin fin placement assembly 200 with the middle plate 202 in a non-pulled-out position and in a pulled-out position, respectively. The middle plate 202 is laterally movable relative to the top plate 201 or the bottom plate 203. The middle plate 202 remains in the non-pulled-out position as the pin fins 125 are placed or otherwise driven into the apertures 250 in the top plate 201. The middle plate 202 supports the pin fins 125 within the apertures 250. As described above, the apertures 250 formed in the top plate 201 are vertically aligned with the apertures 252 formed in the bottom plate 203. The top plate 201, middle plate 202, and the bottom plate 203 in combination form a plate body 277. The supporting post 255 is formed below the plate body 277.

After the pin fins 125 are placed in the desired position, such as in the apertures 250 in the top plate 201, the middle plate 202 may be moved laterally position, as shown in FIG. 3B. As a result, the pin fins 125 may drop down into apertures 252 and contact the solder paste 124 formed on the IC die 105 (not shown).

As the numbers, profiles, and distributions of the pin fins 125 formed on the IC die 105 may include different configurations and requirements, a pre-manufactured pattern provided from the pin fin placement assembly 200 may assist in placing the pin fins 125 on the IC die efficiently and precisely. For example, in conventional manners, individual pasting of the pin fins 125 on the IC die often results in inaccurate alignment, time consuming, and positional errors during the process of the placement. By utilizing the pin fin placement assembly 200, the desired patterns, distributions, profiles and configurations of the pin fins 125 may be pre-molded and formed in the top and bottom plates of the pin fin placement assembly 200. Thus, once the pin fins are driven and placed into the apertures formed in the pin fin placement assembly 200, the pin fins are ready to be positioned and soldered onto the IC die with the desired distribution and patterns, thus providing a time-efficient and precise placement of the pin fins on the IC die with minimum errors. Thus, the pin fin placement assembly enables large amounts of pin fins (e.g., tens of thousands or more) to be simultaneously placed on the IC die, instead of being individually placed, soldered and positioned and soldered.

Figure 4A:
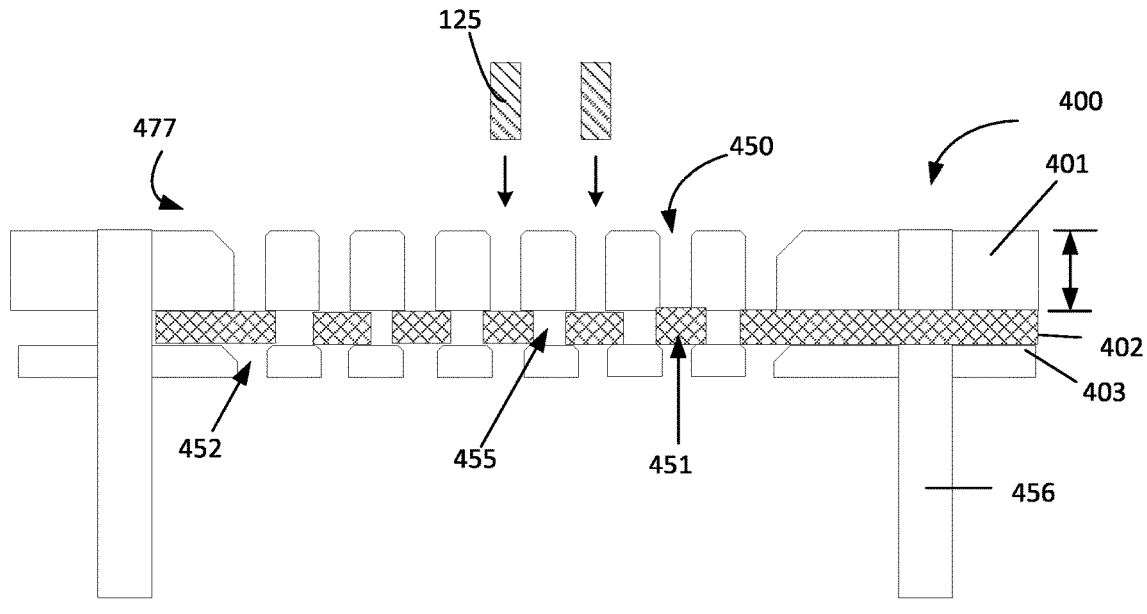
FIGS. 4A-4B depict cross-sectional views of an example of a pin fin placement assembly.
Figure 4B:
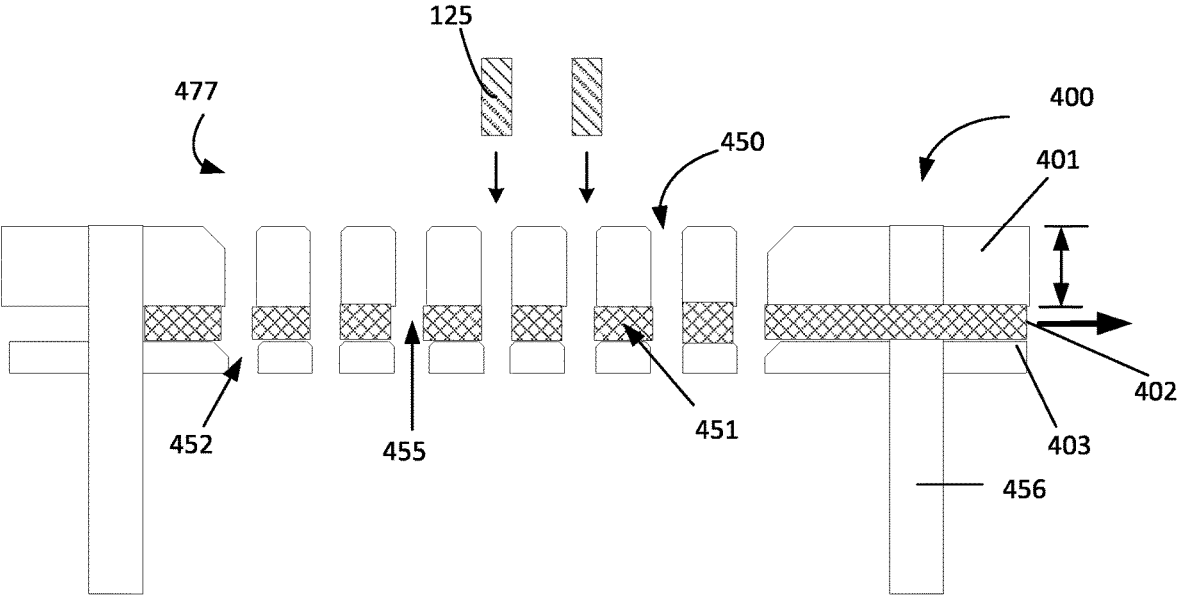

FIGS. 4A-4B depict cross-sectional views of another example of the pin fin placement assembly 400 with the middle plate 402 in a non-pulled-out position and in a pulled-out position, respectively. The middle plate 402 of FIGS. 4A-4B has a plurality of apertures 455 formed therein, providing a structural difference as compared to the middle plate 202 depicted in FIGS. 3A-3B with a solid plate structure. The middle plate 402 has a similar operational mechanism to allow a laterally movement of the middle plate 402 relative to the top plate 401 or the bottom plate 403. The middle plate 402 remains in the non-pulled-out position as the pin fins 125 are placed or otherwise driven into the apertures 450 in the top plate 401. The middle plate 402 with the portions 451 without the apertures 455 supports the pin fins 125 within the apertures 450. Once the pin fins 125 are placed in the desired position, such as in the apertures 450 in the top plate 401, the middle plate 402 may be laterally pulled to allow the apertures 455 in the middle plate 402 to be aligned with the apertures 450 in the top plate 401 and the apertures 452 in the bottom plate 403, as depicted in FIG. 4B. Once the apertures 450, 455 and 452 are vertically aligned, the pin fins 125 may be dropped down to the apertures 452 in the bottom plate 403. In this configuration depicted in FIGS. 4A-4B, the middle plate 402 may only be moved laterally in a relatively short distance that may allow alignment of the apertures 455 in the middle plate 402 with the apertures 450, 452 in the top and bottom plates 401, 403. For example, the middle plate 402 may only need to be laterally moved to allow the portions 451 of the middle plate 402 to be vertically offset from the apertures 450, 452 in the top and bottom plates 401, 403, instead of pulling the middle plate 202 laterally to the very end relative to the top and the bottom plate 201, 203, as depicted in the example of FIG. 3A-3B. By such configuration, a relatively small apparatus footprint and small operational space are obtained.

Figure 5:
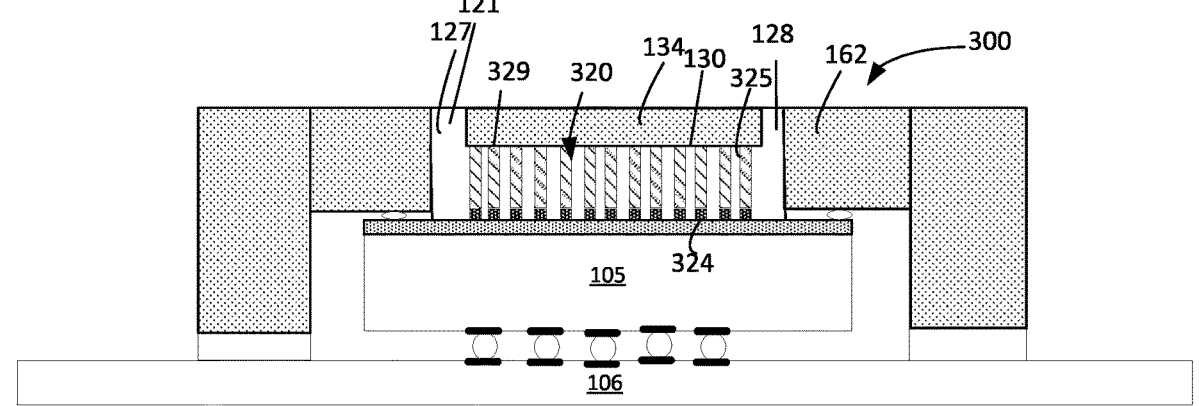
FIG. 5 depicts a cross-sectional view of an example of temperature control elements formed by the pin fin placement assembly in accordance with aspects of the disclosure.

FIG. 5 depicts a cross-sectional view of a different example of temperature control elements 300 utilized to control temperatures of the IC die 105 assembled in the IC package assembly in accordance with aspects of the disclosure. The temperature control element 300 of FIG. 5 is similar to the temperature control element 151 depicted in FIG. 1, except that the thermal dissipating features 320 may be configured differently. For example, the thermal dissipating features 320 may have a top surface 329 in direct contact with the bottom surface 130 of the center portion 134 of the ceiling 162. Thus, the height of the pin fins 325 selected to form the thermal dissipating features 320 is configured differently to accommodate this configuration.

Figures 6A, 6B:
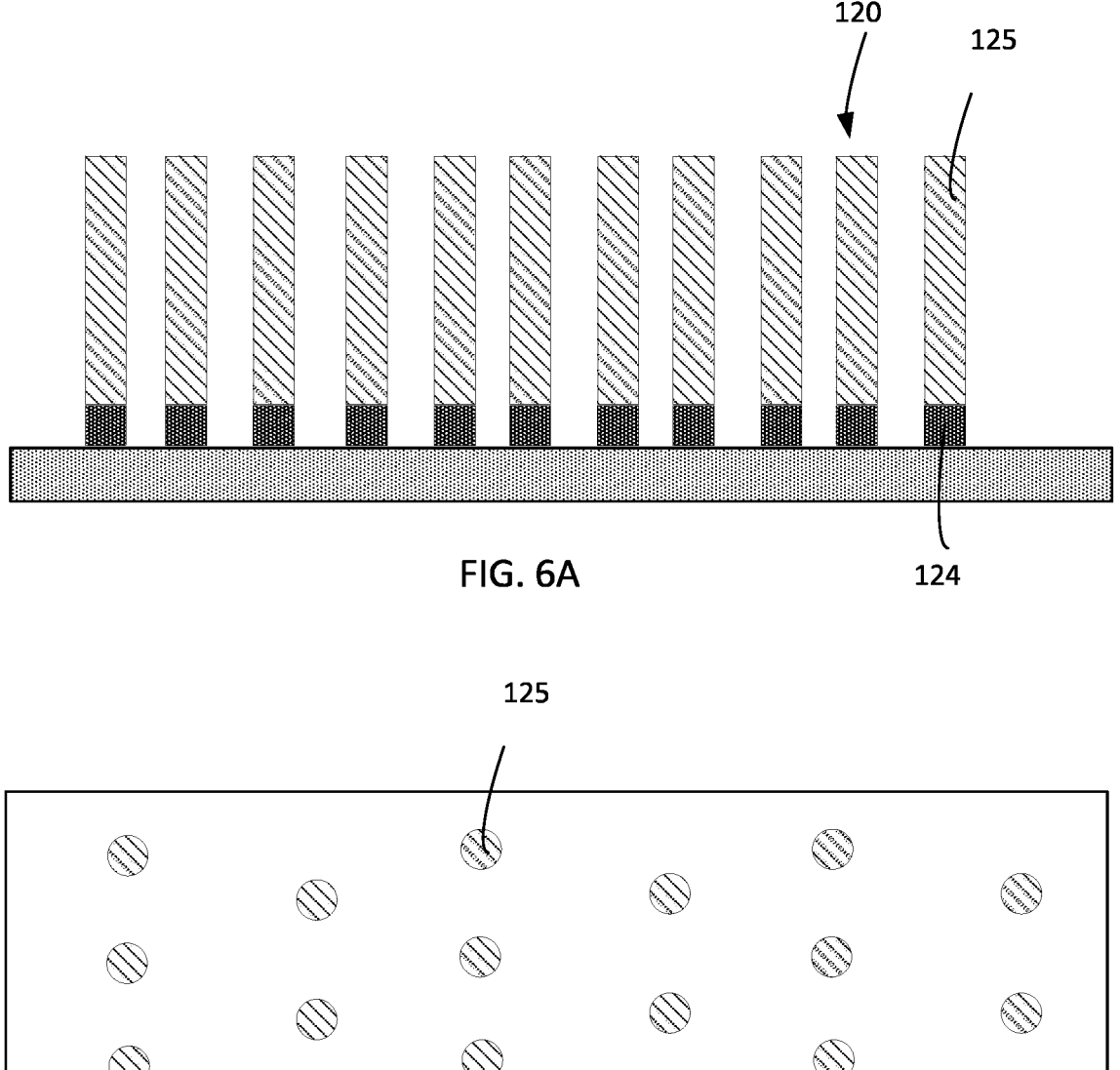
FIG. 6A depicts a cross-sectional view of a plurality of thermal dissipating features in accordance with aspects of the disclosure.
FIG. 6B depicts a top view of the plurality of thermal dissipating features of FIG. 4A in accordance with aspects of the disclosure.

FIG. 6A depicts a cross-sectional view of the plurality of thermal dissipating features 120 and FIG. 6B depicts a top view of the thermal dissipating features 120 of FIG. 6A. As described above, the thermal dissipating feature 120 includes the pin fin 125 disposed on the solder paste 124. The thermal dissipating feature 120 may be configured as arrays or matrix that includes multiple thermal dissipating features 120 equally or non-equally spaced apart from each other. As depicted in the top view of the thermal dissipating feature 120 in FIG. 6B, the thermal dissipating feature 120 may be configured in a circular configuration to facilitate thermal dissipation. In one example, the thermal dissipating feature 120 may have a diameter between about 20 μm and about 80 μm.

Figure 7A:
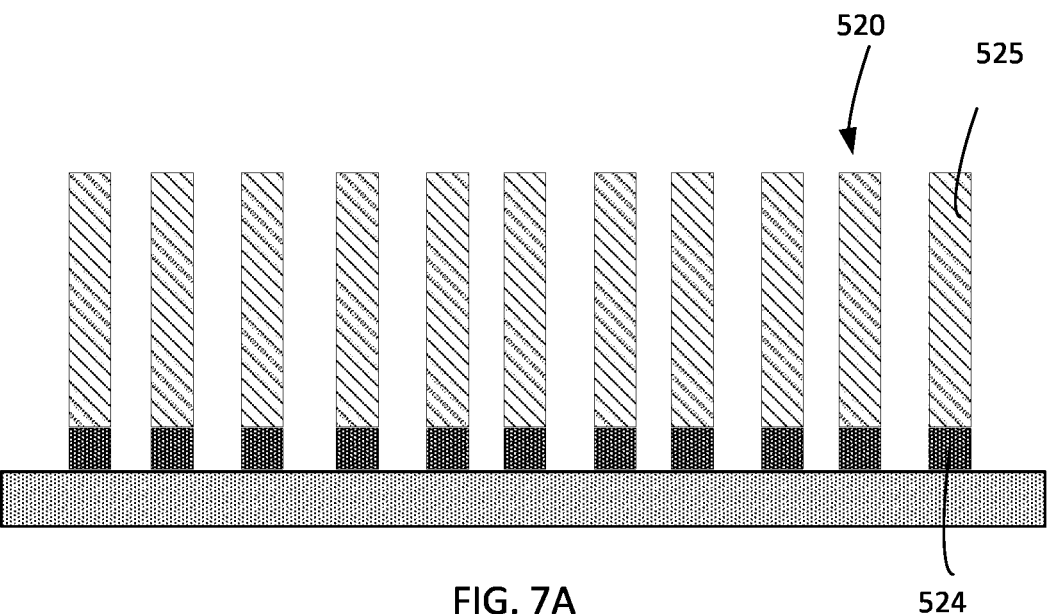
FIG. 7A depicts a cross-sectional view of another example of a plurality of thermal dissipating features in accordance with aspects of the disclosure.
Figure 7B:
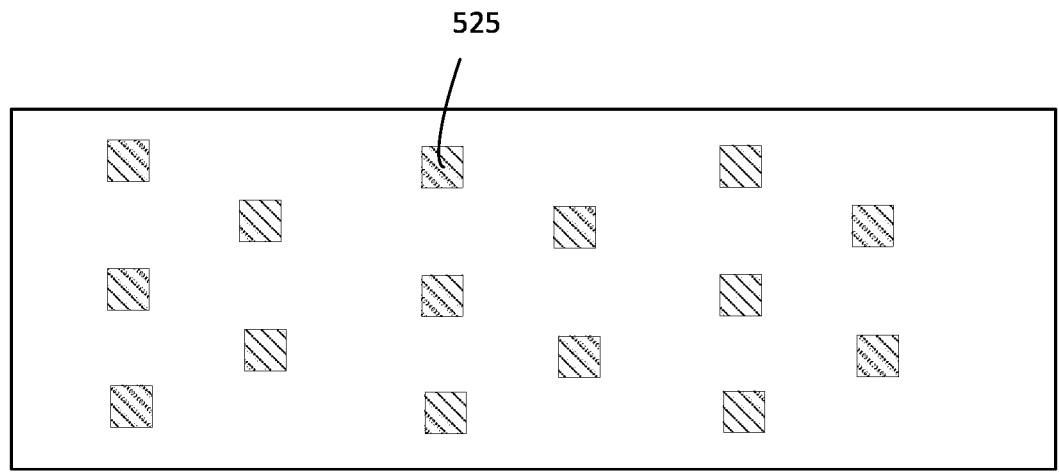
FIG. 7B depicts a top view of the plurality of thermal dissipating features of FIG. 7A in accordance with aspects of the disclosure.

In another example, depicted in FIGS. 7A-7B, the thermal dissipating feature 520 includes the pin fin 525 disposed on the solder bump 524, as shown in the cross-sectional view of FIG. 7A. The thermal dissipating feature 520 may be configured as arrays or matrix that includes multiple thermal dissipating features 520 equally or non-equally spaced apart from each other. The thermal dissipating feature 520 may be configured to have a rectangular configuration, as shown in the top view in FIG. 7B. It is noted that the thermal dissipating feature 520 may be a longitudinal structure. For example, the thermal dissipating feature 520 may have a dimension between about 20 μm and about 80 μm.

It is noted that based on different configurations, densities, distributions, and profiles of the pin fins 125, 525, the apertures 250, 252 formed in the top plate 201 and the bottom plate 203 may be changed or altered accordingly to accommodate different configurations, densities, distributions, and profiles of the pin fins 125, 525.

FIG. 8 depicts a flow diagram for manufacturing an IC package including an IC die having a temperature control element utilized to control the temperature of the IC die in accordance with aspects of the disclosure. Such method may be performed using suitable manufacturing processes, including depositing, etching, lithography, polishing, soldering, or any suitable techniques. It should be understood that the operations involved in the following methods need not be performed in the precise order described. Rather, various operations may be handled in a different order or simultaneously, and operations may be added or omitted.

Referring to FIG. 8, in block 802, an IC die, such as the IC die 105 described above, may be disposed on a PCB, such as the PCB 106 described above. The IC die 105 may include device structures, transistors, or other electronic components formed on a device region of the IC die 105.

In block 804, a metallization layer, such as the metallization layer 110, may be formed on the IC die. The metallization layer may be formed on a surface opposite of the surface where the device structures, transistors, or other electronic components are formed in the device region of the IC die.

In block 806, a pin fin placement assembly 200 is placed over the IC die 105 on the PCB 106.

In block 808, the middle plate 202 of the pin fin placement assembly 200 is laterally pulled out to allow the pin fins 125 to be dropped onto the solder paste 124 disposed on the IC die 105.

In block 810, a thermal process is performed on the pin fins 125 to allow the pin fins 125 to securely adhered and soldered onto the solder paste 124 or metallization layer 110 formed on the IC die 105.

In block 812, once the pin fins 125 are securely adhered and soldered onto the solder paste 124, the pin fin placement assembly 200 may be removed from the PCB 106. Thus, a plurality of thermal dissipating features 120 may be disposed on the IC die 105.

In block 814, a manifold 150 is placed on the PCB 106 to encase the IC die 105 therein while maintaining the plurality of thermal dissipating features 120 located in a plenum 121 defined in the manifold 150.

In block 816, a fluid may be supplied into the plenum 121 of the manifold 150 to efficiently control the temperature of the IC die 105 through the plurality of thermal dissipating features 120.

In block 818, a temperature control element including the manifold 150 and the plurality of thermal dissipating features 120 is then implemented on the PCB 106 encasing the IC die 105 to form an IC package assembly with efficiency temperature dissipation control.

The features described herein allow a temperature control element being formed as an integral part of an IC package assembly that may have high heat dissipation efficiency to an IC die during operation assembled in the package assembly. The temperature control element may assist in temperature control of the IC die when in operation. In one example, the temperature control element may have a plurality of thermal dissipating features disposed on a first surface of the IC die encased under a manifold to efficiently control and dissipate the thermal energy from the IC die when in operation. A second surface opposite to the first surface of the IC die may include a plurality of devices, such as semiconductors transistors, devices, electrical components, circuits, or the like, that may generate thermal energy when in operation. The thermal dissipating features may be manufactured by utilizing the pin fin placement assembly to efficiently and precisely the pin fins on desired locations of the IC die. Different configurations of the thermal dissipating features may be utilized to accommodate different device layouts with different thermal energy generation across the substrate in the IC die. Thus, the temperature control element may provide an IC die with high efficiency of heat dissipation that is suitable for 3D IC package structures and requirements.

Although the technology herein has been described with reference to particular examples, it is to be understood that these examples are merely illustrative of the principles and applications of the present technology. It is, therefore, to be understood that numerous modifications may be made, and other arrangements may be devised without departing from the spirit and scope of the present technology as defined by the appended claims.

The invention claimed is:

1. A method for manufacturing a temperature control element in an IC package, comprising:
   coupling a pin fin placement assembly to a printed circuit board ("PCB"), the pin fin placement assembly comprising a top plate, a bottom plate, and a middle plate disposed between the top and bottom plates;

providing a plurality of pin fins in a first plurality of apertures in the top plate of the pin fin placement assembly;

moving the middle plate in a lateral direction relative to the top and bottom plates, such that the plurality of pin fins within the first plurality of apertures moves into a second plurality of apertures in the bottom plate of the pin fin placement assembly; and performing a thermal process to solder the plurality of pin fins to an IC die positioned at the PCB.

2. The method of claim 1, further comprising:
   removing the pin fin placement assembly from the PCB.

3. The method of claim 1, further comprising:
   driving the plurality of pin fins into the first plurality of apertures in the top plate by vibration or brushing.

4. The method of claim 3, wherein the first plurality of apertures formed in the top plate is vertically aligned with the second plurality of apertures formed in the bottom plate.

5. The method of claim 1, further comprising:
   maintaining the plurality of pin fins in the second plurality of apertures formed in the bottom plate in the pin fin placement assembly while performing the thermal process.

6. The method of claim 1, wherein coupling the pin fin placement assembly further comprises:
   placing the pin fin placement assembly into an alignment hole formed in the PCB.

7. The method of claim 1, wherein the pin fins are manufactured from a material selected from copper, aluminum, tungsten, gold, silver, combinations thereof or alloys thereof.

8. The method of claim 1, wherein the plurality of pin fins have one of a circular configuration, a rectangular configuration, a longitudinal structure, or a combination thereof.

9. The method of claim 1, wherein the plurality of pin fins are arranged in one or more arrays or matrices.

10. The method of claim 1, wherein when the middle plate moves in the lateral direction, the top and bottom plates are in a stationary position.

11. The method of claim 1, wherein when the middle plate is in a first position, the middle plate supports the pin fins within the first plurality of apertures and prevents movement of the plurality of pin fins into the second plurality of apertures, and when the middle plate moves in the lateral direction into a second position, the plurality of pin fins move into the second plurality of apertures.

12. The method of claim 11, wherein the middle plate further comprises a third plurality of apertures for receiving the plurality of pin fins, and wherein when the middle plate is moved in the lateral direction, the first, second, and third plurality of apertures are aligned with each other, such that the plurality of pin fins move from the first plurality of apertures, through the third plurality of apertures, and into the second plurality of apertures.

13. The method of claim 11, further comprising:
   simultaneously aligning each of the plurality of pin fins in the second plurality of apertures with a corresponding one of a plurality of solder materials deposited at a rear surface of the IC die.

14. A pin fin placement assembly, comprising:
   a top plate, a middle plate, and a bottom plate vertically assembled to form a plate body, wherein the middle plate is laterally movable relative to the top plate or the bottom plate;
   a supporting post disposed below the plate body;
   a first plurality of apertures formed in the top plate; and
   a second plurality of apertures formed in the bottom plate, wherein the first and the second plurality of apertures are vertically aligned, and wherein the first and the second plurality of apertures are configured to receive pin fins to be disposed on an IC die.

15. The pin fin placement assembly of claim 14, wherein the top plate is removable from the plate body.

16. The pin fin placement assembly of claim 14, wherein the first plurality of apertures are configured to receive a corresponding pin fin to be disposed therein.

17. The pin fin placement assembly of claim 14, wherein the supporting post is configured to be placed into an alignment hole formed in a printed circuit board ("PCB").

18. The pin fin placement assembly of claim 14, wherein when the middle plate moves in the lateral direction, the top and bottom plates are in a stationary position.

19. The pin fin placement assembly of claim 14, wherein the pin fin placement assembly is configured to permit pin fins in the first plurality of apertures to move into the second plurality of apertures when the middle plate is moved in a lateral direction.

20. The pin fin placement assembly of claim 19, wherein when the middle plate is in a first position, the middle plate supports the pin fins within the first plurality of apertures and prevents movement of the pin fins into the second plurality of apertures, and when the middle plate moves laterally into a second position, the pin fins drop into the second plurality of apertures.

\* \* \* \* \*